United States Patent [19]

Mayer

[11] 4,399,484
[45] Aug. 16, 1983

[54] INTEGRAL ELECTRIC MODULE AND ASSEMBLY JET COOLING SYSTEM

[75] Inventor: Arnold H. Mayer, Dayton, Ohio

[73] Assignee: The United States of America as represented by the Secretary of the Air Force, Washington, D.C.

[21] Appl. No.: 242,502

[22] Filed: Mar. 10, 1981

[51] Int. Cl.³ .............................................. H05K 7/20
[52] U.S. Cl. .......................... 361/382; 165/DIG. 11; 361/383; 361/415
[58] Field of Search ........................ 174/15 R, 16 R; 165/DIG. 11, 122; 339/112 R; 62/414, 418, 427; 361/381–385, 415

[56] References Cited

U.S. PATENT DOCUMENTS

| | | | |
|---|---|---|---|
| 2,187,011 | 1/1940 | Braden | 62/89 |
| 2,843,806 | 7/1958 | O'Neill | 317/100 |
| 3,626,251 | 12/1971 | Vigue | 317/100 |
| 3,843,910 | 10/1974 | Rinquet | 165/DIG. 11 |
| 3,844,343 | 10/1974 | Burgraff | 165/109 |
| 3,967,874 | 9/1975 | Calabro | 339/112 R |
| 4,006,388 | 2/1977 | Bartholomew | 317/100 |
| 4,122,508 | 10/1978 | Rumbaugh | 361/384 |

FOREIGN PATENT DOCUMENTS 2015361 6/1979 Fed. Rep. of Germany ...... 361/383

Primary Examiner—G. P. Tolin
Attorney, Agent, or Firm—Donald J. Singer; Bobby D. Scearce

[57] ABSTRACT

An improved printed circuit board housing assembly is described wherein localized high intensity cooling of heat dissipating electronic components mounted on the circuit boards may be accomplished by direct impingement of streams of fluid coolant onto individual components; when coolant is passed through the housing, fluid streams, generated at openings provided in the circuit boards, impinge onto electronic components mounted on the next circuit board downstream from the source of coolant flow.

7 Claims, 4 Drawing Figures

INTEGRAL ELECTRIC MODULE AND ASSEMBLY JET COOLING SYSTEM

RIGHTS OF THE GOVERNMENT

The invention described herein may be manufactured and used by or for the Government of the United States for all governmental purposes without the payment of any royalty.

BACKGROUND OF THE INVENTION

This invention relates generally to methods and apparatus for cooling electronic components housed within an electronics assembly package or cabinet, and more specifically to improved housing and circuit boards comprising an electronic assembly package particularly adapted to provide cooling to heat generating electronic components mounted on the circuit boards by impingement of streams of fluid coolant onto such electronic components.

Existing systems for cooling electronic components mounted upon circuit boards normally provide circulation of fluid coolant (usually air) either by means of a blower system adapted to circulate the coolant throughout the housing containing the electronics (e.g., U.S. Pat. No. 2,187,011 to Braden; U.S. Pat. No. 3,626,251 to Vigue), or by means of a suitably constructed housing having chambers, baffles, ducts, and spaced wall structures for conducting the coolant to various locations within the housing (e.g., U.S. Pat. No. 3,967,874 to Calabro; U.S. Pat. No. 2,843,806 to O'Neill; U.S. Pat. No. 4,006,388 to Bartholomew). Modern demands for compact, lightweight electronic packages containing, for example, a large number of closely spaced or stacked electronic circuit boards have not been fully satisfied by these existing systems because such systems may provide unsatisfactory coolant flow to specific electronic components to be cooled due to such components being shielded from the coolant flow by other components or circuit boards, or because such components are mounted within the housing too remotely from the source of coolant to be effectively cooled. Existing systems providing coolant circulation through ducts and the like integrated into the housing often add undesirable weight and bulk to the overall electronics package, especially in airborn applications where space and weight are premium considerations.

SUMMARY OF THE INVENTION

The present invention overcomes the foregoing problems in the prior art by providing an improved circuit board housing assembly wherein localized high intensity cooling of heat dissipating electronic components mounted on the circuit boards may be accomplished by direct impingement of streams or jets of fluid coolant onto such component, and wherein each circuit board within the assembly has one or more openings to provide streams or jets for impingement onto components mounted on the next successive board downstream from the source of coolant flow. Normal board spacing within electronic circuit board assemblies provides sufficient coolant flow passages.

The present invention has particular application in providing highly efficient cooling to electronic equipment employing spaced circuit board assemblies where weight and volume considerations are important, and substantially diminishes in importance considerations of housing to coolant temperature differential.

It is, therefore, an object of the present invention to provide an improved integral electronic module and assembly cooling system.

It is a further object of the present invention to provide a circuit board housing assembly wherein a heat dissipating electronic component mounted on a circuit board may be individually cooled by impingement of coolant flow directly onto the component.

It is still a further object of the present invention to provide an improved circuit board including means for directing streams of coolant flow onto an electronic component mounted on an adjacent board.

These and other objects of the invention will become apparent as the description thereof proceeds.

DESCRIPTION OF THE DRAWINGS

The invention will be more clearly understood from the following detailed description of specific embodiments thereof read in conjunction with the accompanying drawings wherein.

DETAILED DESCRIPTION

The present invention is a unique application of the high intensity heat transfer mechanisms present at a stagnation point and in the entrance region of ducts to the problem of cooling heat generating electronic components mounted on stacked or parallel spaced printed circuit boards within the housing of an electronics assembly. A coolant flowing under pressure in a direction generally perpendicular to the circuit boards may pass through the holes provided in the boards, and, as the coolant passes through the holes, fluid jets are formed at those holes which may impinge directly upon electronic components mounted on the next adjacent circuit board downstream from the source of coolant flow thereby providing localized and highly efficient cooling to those components. Either gaseous or liquid coolant may be acceptable within the scope of the invention herein. Forced air, which may be previously filtered or dehumidified, is normally used in applications of this invention.

Figure 1:
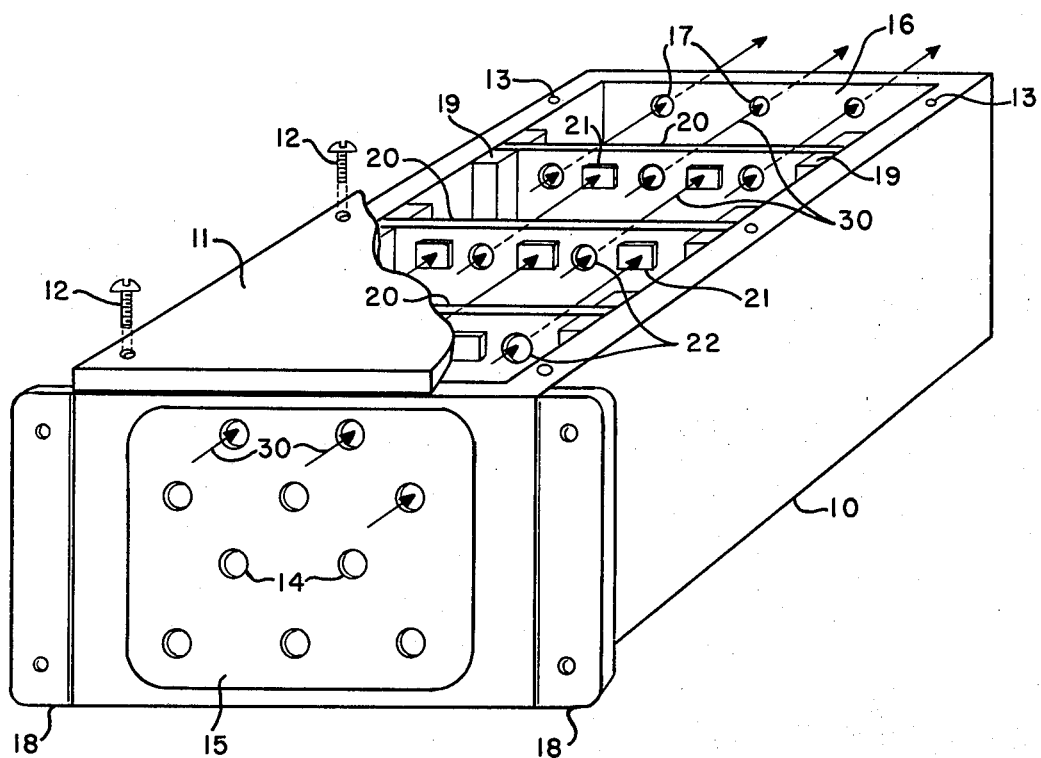
FIG. 1 is a schematic in partial cutaway of a typical housing and circuit board assembly of the present invention.

Referring now to the drawings, FIG. 1 illustrates one embodiment of the housing and circuit board assembly of the present invention.

As shown in FIG. 1, the present invention comprises a suitable housing 10 containing one or more electronic module cards depicted as printed circuit boards 20. Housing 10 is depicted in the drawings as having generally the shape of a hollow rectangular parallelopiped, however, within the scope of the present invention, the size, shape, and material of construction of housing 10 is not of critical importance so long as the function thereof as described is served. Cover plate 11 may comprise one side of housing 10 and is shown in partial cutaway to disclose a typical parallel spaced arrangement of circuit boards 20 within housing 10. The cover plate 11 may be secured through any conventional means such as mounting screws 12 and mating holes 13. Housing 10 has in one end thereof one or more inlet openings or coolant jet forming holes 14 such as shown in FIG. 1 in first end plate 15. First end plate 15 having holes 14 serves, in the embodiment depicted, as the inlet to housing 10 for coolant flow into the interior thereof. A second end plate 16 of housing 10 and remote in position to first end plate 15, may have one or more exhaust openings 17 therein to exhaust coolant from housing 10.

First end plate 15 may be provided with any suitable conventional mounting means, such as flanges 18, by which housing 10 may be connected to a source of coolant flow, such as a pump, blower, fan, or the like (not shown). Any such conventional means for providing flow of an appropriate coolant, such as forced air, as is well known in the art may be acceptable for use in conjunction with the present invention, and further, more than one housing 10 may be interconnected to a single source of coolant through any conventional means such as a plenum, manifold, or the like. The coolant flow may also be effected through means communicating with the exhaust openings 17 for reducing the pressure at the exhaust openings, e.g., by a vacuum pump, exhaust fan, or the like, whereby coolant may be drawn through the housing 10. Further, and for example, in the event pressure losses or gradients throughout housing 10 presents a problem in a particular application, it may be desirable to use both coolant pressurization at the inlet and evacuation at the outlet of housing 10. Pressure losses or gradients within a housing of this invention may be otherwise minimized by providing more than one inlet (serving substantially the same purpose as plate 15) interfacing with a source of coolant flow and having exhaust openings in the housing positioned intermediate the inlets.

Along the interior surfaces of housing 10 may be disposed one or more circuit board mounting devices or guides 19 which may hold circuit boards 20 in a spaced, generally parallel array, and which may also provide the means (not shown) for integrating the electronic circuitry and electronic components on the circuit boards into an electrical system.

Figure 2:
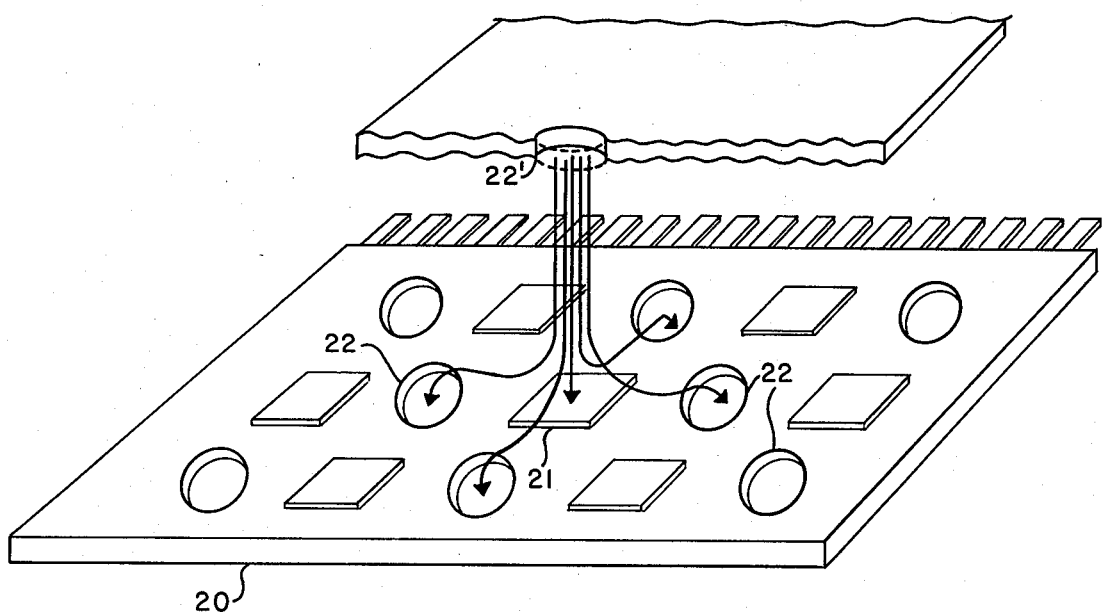
FIG. 2 is a perspective view of a typical circuit board of the present invention.

Referring to FIGS. 1 and 2, circuit board 20 may have thereon conventional printed circuit configurations (not shown) and one or more electronic components 21. The electronic components 21 may generate heat during operation, and, in order to preserve the operational efficiency of such components, it may be desirable to provide cooling to those components.

Circuit board 20 of the present invention may have one or more holes 22 allowing passage of coolant flow therethrough and providing means for generating jets or streams of coolant to impinge onto the next successive board in a parallel spaced configuration. Holes 22 may be provided at such positions on alternate circuit boards that they appear directly opposite a heat generating electronic component 21 on the next successive circuit board downstream from the source of coolant flow in a manner such as illustrated in FIG. 1 by coolant flow lines 30. Thus, a fluid jet formed at a hole 22 in one circuit board 20 may impinge directly on an electronic component 21 mounted on the next successive circuit board downstream from the source of coolant flow. FIG. 2 demonstrates the flow pattern of a typical single jet of coolant, formed at a hole 22' in a preceding board, onto an electronic component 21 on circuit board 20 and through nearby holes 22.

First end plate 15, which comprises the inlet for coolant flow to housing 10, may have therein a plurality of holes 14 positioned opposite heat generating electronic components 21 on the first circuit board 20 of the spaced parallel configuration depicted in FIG. 1. Inlet holes 14 in plate 15 may thereby serve substantially the same purpose as described for holes 22 in circuit board 20 to generate jets or streams of coolant for impingement onto the first circuit board.

The diameter of holes 22 of circuit board 20 as shown in FIGS. 1 and 2 may be selected to maximize heat transfer from heat generating electronic components mounted on the circuit boards 20, and to minimize fluid pressure losses throughout housing 10. A diameter of hole 22 corresponding to a ratio of spacing between circuit boards to hole diameter of approximately 6:1 provides maximum heat transfer by the impingement of isolated fluid jets onto heat generating components, although circuit board configurations including somewhat larger or smaller such ratios, such as from about 4:1 to about 10:1, result in the formation of fluid jets for cooling and may be satisfactory in a given assembly. For example, circuit board spacings within conventional electronic circuit board assemblies may be of the order of about one-half inch (1.27 cm) to about one inch (2.54 cm), which, as discussed above, for optimum heat transfer, would correspond to a diameter of hole 22 of about 0.083 inch (0.211 cm) to about 0.167 inch (0.423 cm). For some applications, larger hole size may be required to reduce fluid pressure losses or gradients within the housing.

Figure 4:
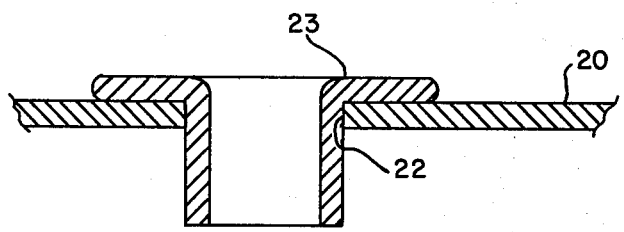
FIG. 4 is a partial cross-section view of a typical circuit board of the present invention illustrating placement of a smooth eyelet in the circuit board.

Fluid flow pressure losses or gradients within housing 10 associated with repeated acceleration of fluid through holes 22 and deceleration upon impingement upon an electronic component 21 may total one dynamic head, Q (where $Q=0.5\rho v^2$; $\rho=$fluid density, v=velocity of flow) due to impingement and 0.5 Q due to flow contraction through a sharp edged orifice (such as hole 22) for a total of 1.5 Q per impingement within housing 10. Reduction of such pressure losses may be effected by providing a smooth rounded surface to the holes 22 or by providing a smooth insert, such as extruded eyelet 23 of FIG. 4, to the hole 22 in circuit board 20; eyelet 23 presents a smooth rounded surface on the fluid inlet (top) surface of circuit board 20 and a well defined smooth duct for flow through the circuit board, and by reason thereof, fluid contraction pressure loss may be reduced to approximately 0.1 Q.

Holes 22 are depicted in the figures as having a generally circular shape, and may be preferred to facilitate the formation of fluid jets. However, the shape of the holes is not critical within the scope of this invention, so long as fluid jets are formed to perform the cooling function described. For example, elongated holes (not shown in the figures) may be desirable in a particular application to provide a broad stream to impinge upon an electronic component of generally elongated shape, or upon two or more closely spaced components.

Holes 22 in circuit boards 20 may be provided through any conventional process, such as by drilling or stamping. In the event that circuit boards are used which have a plurality of layers, one or more of which may be conductive layers, it may be desirable to seal the peripheral surfaces of holes 22 exposing those layers by conventional coating or dipping processes known in the art to avoid short circuits within the board or to prevent delamination of the board. Further, it may be desirable to use eyelets 23 composed of suitable non-conductive material both to provide protection to the layers, and to serve their purpose hereinabove described.

Figure 3:
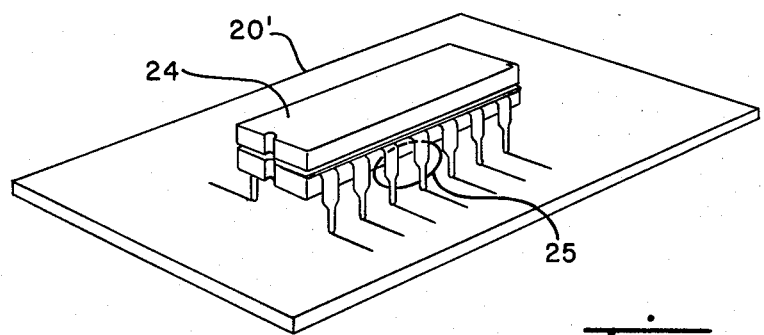
FIG. 3 is a perspective view of a circuit board having an alternative configuration for accommodating an alternate form of electronic device.

As shown in FIG. 3, a circuit board 20' of this invention may be provided for cooling electronic devices 24 which are installed in a spaced relationship to (or stand off from) a surface of circuit board 20'. A hole 25 for passage of coolant through circuit board 20' to the next successive circuit board and for the formation of a coolant jet may be conveniently provided beneath electronic device 24. This configuration has an added advantage that otherwise useable circuit board surface area may not be consumed by hole 25.

The present invention, therefore, provides a unique electronic housing assembly, which may be conveniently adapted to a source of coolant flow, for cooling heat dissipating electronic components mounted on circuit boards within the housing. It is understood that other embodiments of the present invention may be applied as might occur to one having skill in the field of the present invention, and therefore, all such embodiments have not been shown in complete detail. Other embodiments may be developed without departing from the spirit and scope of this invention.

I claim:

1. An improved electronics cooling system comprising:
  a. a housing having an inlet at one end thereof and an outlet at a second end thereof for passage of fluid coolant therethrough;
  b. holding means for maintaining a plurality of printed circuit boards in a spaced and generally parallel array within said housing;
  c. a plurality of printed circuit boards within said housing maintained in a spaced and generally parallel array by said holding means, each of said printed circuit boards having heat generating electronic components mounted thereon and including means defining passageways therethrough configured for passage of said fluid coolant by the formation of fluid jet streams, said passageways positioned to provide direct impingement of said streams onto each component mounted on the next successive board in said array for providing localized and highly efficient cooling to said components; and
  d. means for providing flow of fluid coolant through said housing.

2. The electronics cooling system as recited in claim 1 wherein said inlet defines a plurality of fluid jet forming passageways communicating with the interior of said housing for conducting coolant thereinto by directing fluid jet streams onto the first board in said array.

3. The electronics cooling system as recited in claim 1 wherein said passageway means comprises an eyelet in each said board presenting a smooth duct for forming a fluid jet of said coolant through said printed circuit board.

4. The electronics cooling system as recited in claim 1 wherein the diameter of each said fluid jet forming passageway in said printed circuit board is from about 0.211 cm to about 0.423 cm.

5. The electronics cooling system as recited in claim 1 wherein the ratio of the spacing between said printed circuit boards to the diameter of each said fluid jet forming passageway is from about 4:1 to about 10:1.

6. The electronics cooling system as recited in claim 3 wherein the inside diameter of said eyelet is from about 0.211 cm to about 0.423 cm.

7. The electronics cooling system as recited in claim 3 wherein the ratio of the spacing between said printed circuit boards to inside diameter of said eyelet is from about 4:1 to about 10:1.

* * * * *